(12) United States Patent
Ueno

(10) Patent No.: US 10,333,399 B2
(45) Date of Patent: Jun. 25, 2019

(54) POWER ACTIVATION CONTROL CIRCUIT AND POWER ACTIVATION CONTROL DEVICE

(71) Applicant: KABUSHIKI KAISHA TOSHIBA, Minato-ku (JP)

(72) Inventor: Takeshi Ueno, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/671,342

(22) Filed: Aug. 8, 2017

(65) Prior Publication Data

US 2018/0269784 A1 Sep. 20, 2018

(30) Foreign Application Priority Data

Mar. 17, 2017 (JP) .................. 2017-053531

(51) Int. Cl.
*H02M 3/156* (2006.01)
*G06F 1/30* (2006.01)
(Continued)

(52) U.S. Cl.
CPC ............ *H02M 3/156* (2013.01); *G06F 1/305* (2013.01); *H02M 1/10* (2013.01); *H02M 1/36* (2013.01); *H02N 2/181* (2013.01); *H03K 17/0814* (2013.01); *H02M 2001/008* (2013.01); *H02M 2001/009* (2013.01)

(58) Field of Classification Search
CPC .......... H02M 3/156; H02M 1/10; H02M 1/36; H02M 2001/008; H02M 2001/009; G06F 1/305; H03K 17/0814; H02J 7/35; H02N 2/18; H02N 2/181; H02N 2/188
See application file for complete search history.

(56) References Cited

U.S. PATENT DOCUMENTS 9,507,395 B2    11/2016  Yoda
9,800,170 B2 *  10/2017  Shao ............... H02M 7/066
(Continued)

FOREIGN PATENT DOCUMENTS

EP      2 913 913 A1       9/2015
JP      2015-036864        2/2015
WO   WO 2005/055405 A1    6/2005

OTHER PUBLICATIONS

"Nanopower Energy Harvesting Power Supply," Linear Technology, LCT3588-1, pp. 1-20.

*Primary Examiner* — Adolf D Berhane
*Assistant Examiner* — Jye-June Lee
(74) *Attorney, Agent, or Firm* — Oblon, McClelland, Maier & Neustadt, L.L.P.

(57) ABSTRACT

According to one embodiment, a power circuit includes a DC-DC converter and an activation control circuit. The DC-DC converter converts input voltage into voltage that is different from the input voltage. The activation control circuit sends a first enable signal to start operation of the DC-DC converter when voltage depending on the input voltage becomes equal to or higher than a first threshold voltage, and sends a second enable signal to start operation of a load connected to an output side of the DC-DC converter when the voltage depending on the input voltage becomes equal to or higher than a second threshold voltage. The second threshold is higher than the first threshold voltage.

16 Claims, 5 Drawing Sheets

(51) Int. Cl.
*H02M 1/10* (2006.01)
*H03K 17/0814* (2006.01)
*H02M 1/36* (2007.01)
*H02N 2/18* (2006.01)
*H02M 1/00* (2006.01)

(56) References Cited

U.S. PATENT DOCUMENTS

| | | |
|---|---|---|
| 2004/0078662 A1 | 4/2004 | Hamel et al. |
| 2013/0300385 A1 | 11/2013 | Li et al. |
| 2015/0256062 A1* | 9/2015 | Shirahata ................ H02M 3/04 323/304 |
| 2016/0079855 A1* | 3/2016 | Ramorini .............. H02M 3/158 323/304 |
| 2018/0183256 A1* | 6/2018 | Tanaka ................... H02M 1/00 |

* cited by examiner

POWER ACTIVATION CONTROL CIRCUIT AND POWER ACTIVATION CONTROL DEVICE

CROSS REFERENCE TO RELATED APPLICATIONS

This application is based upon and claims the benefit of priority from the prior Japanese Patent Application No. 2017-053531, filed on Mar. 17, 2017, the entire contents of which are incorporated herein by reference.

FIELD

Embodiments described herein relate to a power circuit and a power device.

BACKGROUND

In energy harvesting, which provides conversion from weak energy in its environment into electric energy using a power generating element such as a solar cell, a thermoelectric generating element, and a piezoelectric element, power output from the power generating element significantly fluctuates depending on environmental conditions. Thus, in general, to buffer fluctuations in power depending on the environmental conditions, temporary accumulation of the power generated by the power generating element in a capacitor is practiced. In addition, voltage output from the power generating element also fluctuates depending on environmental conditions. Thus, use of a DC-DC converter to stabilize voltage to be supplied to a load is practiced.

As related art of DC-DC converters, there is a DC-DC converter that is activated and supplies power to a load via the DC-DC converter when input voltage exceeds predetermined under voltage lock out (UVLO) voltage. However, power generated by the power generating element depends on output voltage of a power generating element. Thus, if the output voltage of the power generating element is inappropriate at a time of activating a DC-DC converter, power supplied to a load runs short, which involves a risk of failure in activating the load.

DETAILED DESCRIPTION

According to one embodiment, a power circuit includes a DC-DC converter and an activation control circuit. The DC-DC converter converts input voltage into voltage that is different from the input voltage. The activation control circuit sends a first enable signal to start operation of the DC-DC converter when voltage depending on the input voltage becomes equal to or higher than a first threshold voltage, and sends a second enable signal to start operation of a load connected to an output side of the DC-DC converter when the voltage depending on the input voltage becomes equal to or higher than a second threshold voltage. The second threshold is higher than the first threshold voltage.

Embodiments of the present invention will be described below with reference to the drawings.

First Embodiment

Figure 1:
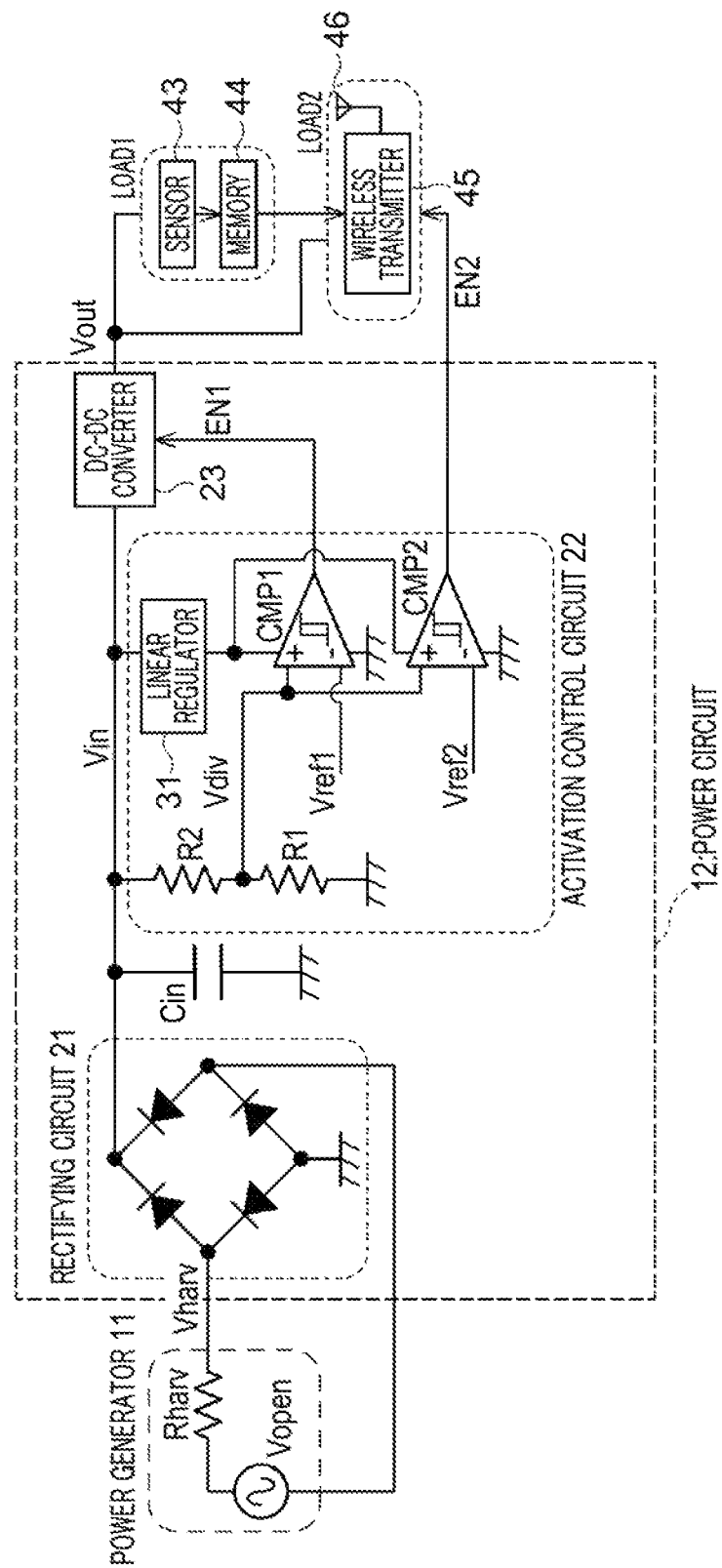
FIG. 1 is a circuit diagram illustrating a configuration example of a power device according to a first embodiment.

FIG. 1 is a circuit diagram illustrating a configuration example of a power device according to a first embodiment. As illustrated in FIG. 1, the power device includes a power generator 11, a power circuit 12, a load 1, and a load 2. This power device relates to energy harvesting, which provides conversion from weak energy in its environment into electric energy using a power generating element such as a solar cell, a thermoelectric generating element, and a piezoelectric element.

The power generator 11 includes at least one power generating element such as a solar cell, a thermoelectric generating element, and a piezoelectric element. The power generating element converts weak energy in its environment into electric energy. The power generating element output the converted electric energy. Voltage of the converted electric energy is AC voltage or DC voltage. In a case where the power generating element is a piezoelectric element or the like, the voltage of the converted electric energy is AC voltage, and in a case where the power generating element is a solar cell, a thermoelectric generating element, or the like, the voltage of the converted electric energy is DC voltage. In the present embodiment, the power generating element is assumed to be a piezoelectric element. Therefore, the power generator outputs AC power. In the drawing, the power generating element is modeled using an electromotive force Vopen and an output resistance Rharv.

The power circuit 12 includes a rectifying circuit 21, a capacitor Cin, an activation control circuit 22, and a DC-DC converter 23. The DC-DC converter is here assumed to be a step-down DC-DC converter and may be a step-up DC-DC converter. An output terminal of the DC-DC converter 23 is connected to the load 1 and the load 2.

The rectifying circuit 21 is configured to convert the AC voltage output from the power generator 11 into DC voltage Vin. In a case where the power generating element is configured to generate DC voltage, the rectifying circuit 21 can be dispensed with. The rectifying circuit 21 may have any configuration such as a diode bridge. In the present embodiment, the rectifying circuit 21 is assumed to be a diode bridge.

Current output from the rectifying circuit 21 is stored in the capacitor Cin. In energy harvesting, generated electric power is unstable. Therefore, use is normally made of a high-capacity capacitor, with which energy is stored in preparation for fluctuations in the generated electric power. Also in the present embodiment, use is made of the capacitor Cin, with which energy generated by the power generator 11 is stored.

Voltage of capacitor Cin (input voltage Vin) is input into the DC-DC converter 23. The DC-DC converter 23 converts the input voltage Vin into voltage Vout lower than the input voltage Vin and suitable for the load 1 and the load 2, and outputs the voltage Vout. The voltage Vout output from the DC-DC converter 23 is supplied to the load 1 and the load 2.

Into the DC-DC converter 23, an enable signal EN1 is input from the activation control circuit 22. When the enable signal EN1 rises to a high level (hereinafter, referred to as High), the DC-DC converter 23 starts a converting operation, and when the enable signal EN1 drops to a low level (hereinafter, referred to as Low), the DC-DC converter 23 stops the converting operation. In other words, while the enable signal EN1 is High, the DC-DC converter 23 performs the converting operation, and while the enable signal EN1 is Low, the DC-DC converter 23 does not perform the converting operation. When the DC-DC converter 23 stops the converting operation, power is no longer output to the loads 1 and 2.

The load 1 operates based on the voltage Vout input from the DC-DC converter 23. The load 1 includes a sensor 43 and a memory 44. The sensor 43 operates while being supplied with the output voltage Vout from the DC-DC converter 23. The memory 44 stores and holds therein data measured by the sensor 43.

Into the load 2, an enable signal EN2 is input from the activation control circuit 22. The load 2 starts operating based on the input voltage Vout when the enable signal EN2 rises to High, and stops operating when the enable signal EN2 drops to Low. In other words, while the enable signal EN2 is High, the load 2 operates, and while the enable signal EN2 is Low, the load 2 does not operate. When the load 2 stops operating, the load 2 no longer consumes power. The load 2 includes a wireless transmitter 45 and at least one antenna 46. The wireless transmitter 45 reads data held in the memory 44 and transmits the data wirelessly.

The activation control circuit 22 includes a resistance R2 and a resistance R1 that are connected to each other in series, two comparators (referred to as a comparator CMP1 and a comparator CMP2), and a linear regulator 31. The resistance R2 and the resistance R1 form a voltage dividing circuit. This voltage dividing circuit divides input voltage of the DC-DC converter 23 to generate voltage Vdiv lower than the input voltage (i.e., voltage in proportion to the input voltage). The division is performed in such a manner as to satisfy Vdiv=Vin×R1/(R1+R2). The linear regulator 31 steps down the input voltage Vin and supplies the stepped-down voltage to the comparators CMP1 and CMP2 as their power supplies. The linear regulator 31 is a kind of DC/DC converter.

The comparator CMP1 compares a reference voltage (threshold voltage) Vref1 with the divided voltage Vdiv (=Vin×R1/(R1+R2)), generates the enable signal EN1 based on a result of the comparison, and provides the enable signal EN1 to the DC-DC converter 23. Specifically, when Vdiv is equal to or higher than Vref1, that is, when the input voltage Vin increases to Vref1×(R1+R2)/R1 or higher, the comparator CMP1 outputs the enable signal EN1 being High, and when Vdiv decreases to below Vref1, the comparator CMP1 outputs the enable signal EN1 being Low.

The comparator CMP2 compares the divided voltage Vdiv with a reference voltage (threshold voltage) Vref2 that is higher than the reference voltage Vref1, generates the enable signal EN2 based on a result of the comparison, and provides the enable signal EN2 to the load 2. Specifically, when Vdiv is equal to or higher than Vref2, that is, when the input voltage Vin increases to Vref2×(R1+R2)/R1 or higher, the comparator CMP2 outputs the enable signal EN2 being High, and when Vdiv decreases to below Vref2, the comparator CMP2 outputs the enable signal EN2 being Low.

As the comparator CMP1 and the comparator CMP2, hysteresis comparators may be used. This can prevent the enable signal EN1 and the enable signal EN2 from being output as narrow pulses when the input voltage Vin slightly varies due to fluctuations in amount of power generation by the power generator 11. FIG. 1 illustrates an example of using hysteresis comparators.

Figure 2:
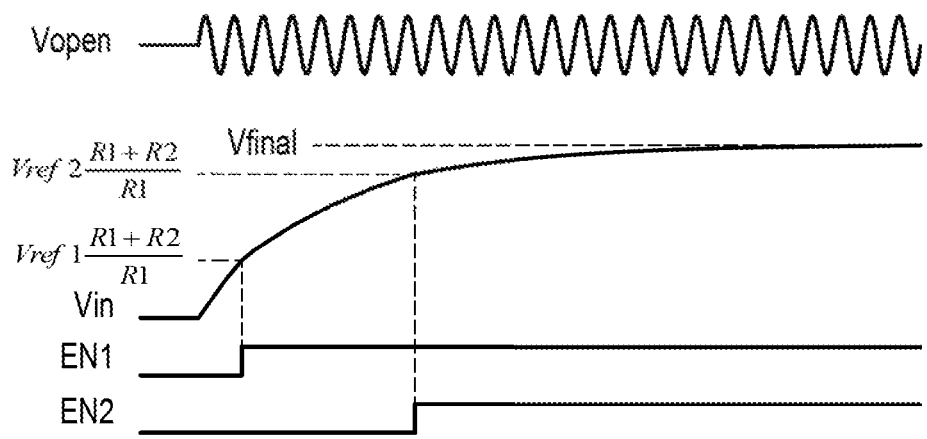
FIG. 2 is a diagram illustrating waveforms of various voltages and signals in the power device illustrated in FIG. 1.

FIG. 2 illustrates voltage waveforms of the power generating voltage Vopen, the input voltage Vin, the enable signal EN1, and the enable signal EN2 in the power device illustrated in FIG. 1.

When the power generator 11 starts power generation, and the power generating voltage Vopen is produced, the input voltage Vin of the DC-DC converter 23 gradually increases. When the input voltage Vin reaches Vref1×(R1+R2)/R1, the enable signal EN1 rises to High. The DC-DC converter 23 starts operating, and power depending on the output voltage of the DC-DC converter 23 is supplied to the load 1. Thereafter, when the input voltage Vin increases to reach Vref2×(R1+R2)/R1, the enable signal EN2 rises to High. The load 2 also starts operating. Thereafter, the input voltage Vin increases to finally reach a voltage Vfinal.

Now, with reference to FIG. 3, description will be made about a relation among the input voltage Vin, a power generator output power (output power of the power generating element) Pharv, a power Pload1 (total power consumed by the DC-DC converter 23 and the load 1), and a power Pload1+Pload2 (total power consumed by the DC-DC converter 23, the load 1, and the load 2). The Pload2 is power consumed by the load 2.

For ease of description, forward voltages of diodes forming the rectifying circuit 21 are ignored. In a case of using a piezoelectric element or other devices as the power generating element, the power generating element electromotive force Vopen is sufficiently higher than the forward voltages of the diodes. Therefore, such an assumption raises no problem.

When the output resistance Rharv of the power generating element takes a nonzero value, the power generator output power Pharv changes depending on the input voltage Vin. That is, when Vin=0 is established, the power generator output voltage (output voltage of the power generating element) Vharv=0 is established. Therefore, Pharv=0 is established. In addition, when the Vin matches an open-circuit voltage Vopenpk of the power generating element, that is, when Vin=Vopenpk is established, Vharv=Vopenpk is established. As a result, no current is output from the power generating element, and Pharv is still zero. According to the maximum power transfer theorem, Pharv reaches its maximum when Vin=0.5*Vopenpk is established. The open-circuit voltage Vopenpk of the power generating element is equivalent to a voltage of a case where no load (the rectifying circuit, the activation control circuit, the DC-DC converter, the load 1, the load 2, etc.) is connected to an output side of the power generator 11.

Figure 3:
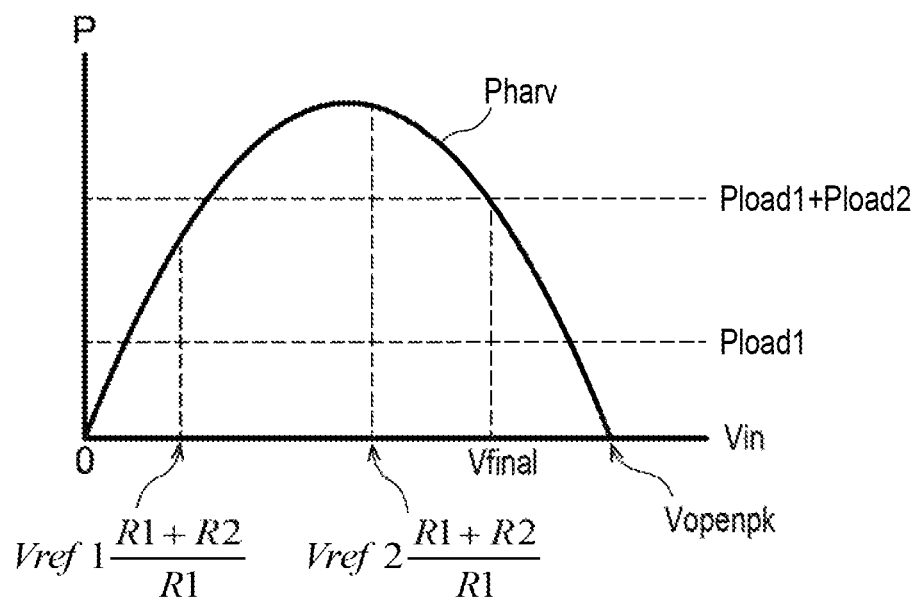
FIG. 3 is a diagram illustrating a relation between input voltage and various powers.

As understood from FIG. 3, at a time point when Vin=Vref1 (R1+R2)/R1 is established, the power generator output power Pharv is lower than Pload1+Pload2 (i.e., Pharv<Pload1+Pload2). Therefore, if the load 1 and the load 2 are driven simultaneously at the time point when Vin=Vref1 (R1+R2)/R1 is established, the generated electric power will run short. As a result, the input voltage Vin and Pharv drop, and activation of the load 1 and the load 2 fails.

In the present embodiment, at the time point when Vin=Vref1 (R1+R2)/R1 is established, only the DC-DC converter 23 and the load 1 are activated that demand the power Pload1, which is lower than the power generator output power Pharv of this point. After the input voltage Vin and Pharv become sufficiently large, the load 2 that demands Pload2 is additionally activated. Specifically, the load 2 is activated at a time point when Vin=Vref2 (R1+R2)/R1 is established. At this point, Pharv is higher than Pload1+ Pload2 (i.e., Pharv>Pload1+Pload2). Therefore, there is no problem if all of the DC-DC converter 23, the load 1, and the load 2 are activated simultaneously. In particular, when Vref2 (R1+R2)/R1 is set at a value that is slightly higher than ½ (=0.5) of the open-circuit voltage Vopenpk of the power generating element, the load 2 can be reliably activated in a vicinity of a maximum value of Pharv. After the activation of the load 2, the input voltage Vin increases to finally reach the voltage Vfinal at which Pharv matches Pload1+Pload2 (i.e., Pharv=Pload1+Pload2 is established). Even if the load 2 is activated when Vin is ½ (=0.5) of the open-circuit voltage Vopenpk of the power generating element or slightly lower for reasons of operation, there is no problem as long as the power generator output power satisfies Pharv>Pload1+Pload2. However, as described above, by activating the load 2 when Vin is slightly higher than ½ of the open-circuit voltage Vopenpk (maximum value), it is possible to keep Pharv>Pload1+Pload2 even when Vin temporarily drops. This causes the generated electric power to tend to increase, and thus the load 2 can be activated more reliably. For example, in a case of using a configuration in which a capacitor is connected between the output terminal and a ground terminal of the DC-DC converter 23, there is a risk that output current of the DC-DC converter 23 temporarily increases until charging of this capacitor is terminated, and Vin temporarily drops. However, even in such a case, the load 2 can be reliably activated.

As seen from the above, by activating the DC-DC converter 23 and the load 1 first, and activating the load 2 next in a process of increase in the input voltage Vin, it is possible to perform a stepwise activation that is appropriate to an amount of power generation by the power generator 11. This enables all the loads to be activated reliably. In addition, by activating the DC-DC converter 23 together with the load 1 in the increase process of the input voltage Vin, there is no need for operation such as activating the DC-DC converter 23 first (earlier than the load 1), which suppress power consumption.

In addition, there is also an advantage that the load 1 can be activated early. For example, the sensor 43 performs sensing in an early stage after the power generator 11 starts the power generation, and stores sensor data in the memory 44. After the load 2 has been activated, the wireless transmitter 45 wirelessly transmits the sensor data stored in the memory 44. This enables sensor data to be acquired earlier than in a case where both of the load 1 and the load 2 are activated simultaneously after the power generator output power Pharv becomes sufficiently high.

Second Embodiment

Figure 4:
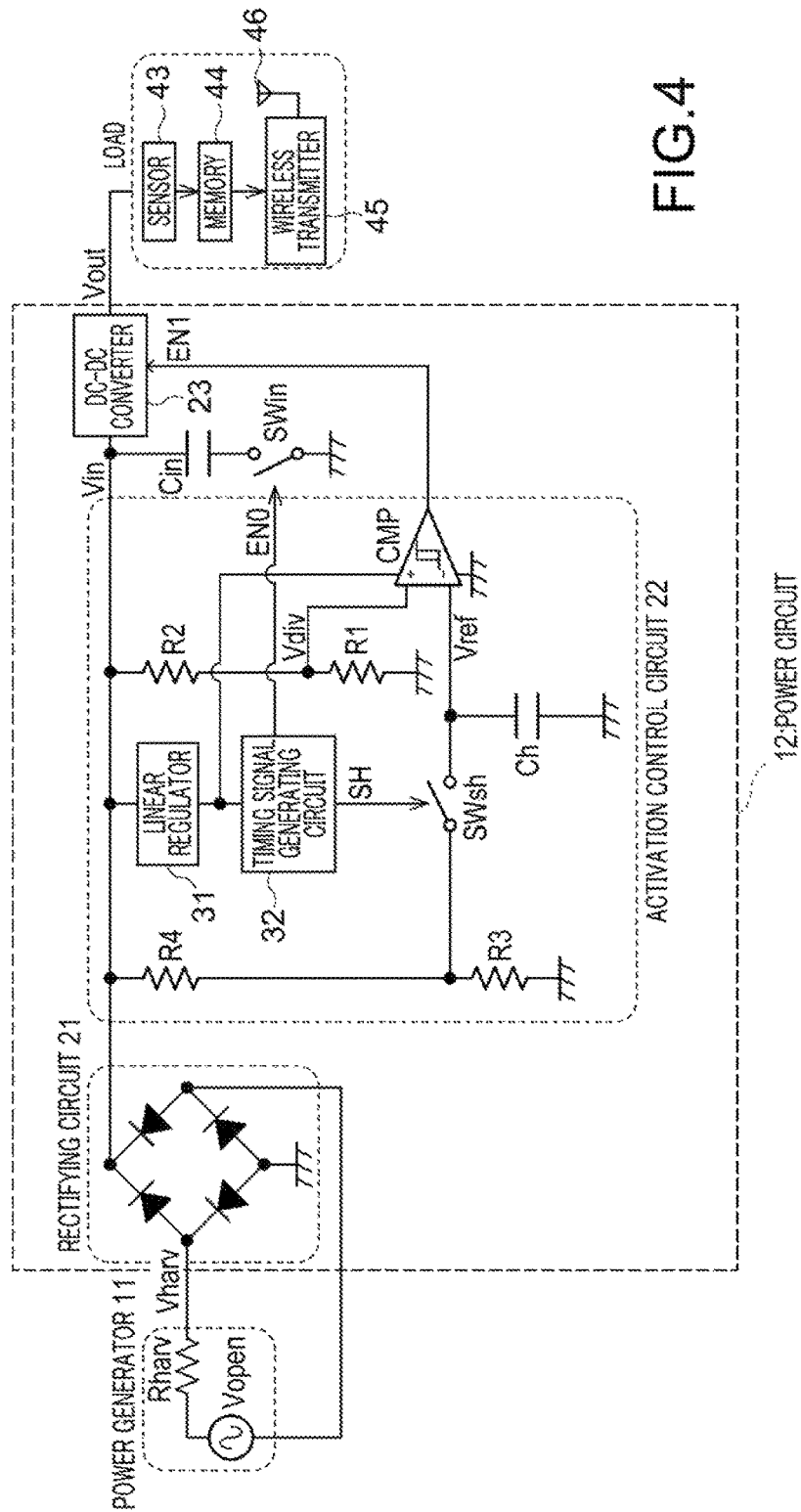
FIG. 4 is a circuit diagram illustrating a configuration example of a power device according to a second embodiment.

FIG. 4 is a circuit diagram illustrating a configuration example of a power device according to a second embodiment. One of features of this power device is to divide the input voltage Vin at no load, using a resistance R4 and a resistance R3, so as to automatically generate a reference voltage (threshold voltage) Vref to be input into a comparator CMP. Elements having the same names illustrated in FIG. 1 will be denoted by the same reference characters, and detailed description will not be made unless such an element performs extended or modified processing.

The loads in the present embodiment include the sensor 43, the memory 44, the wireless transmitter 45, and the antenna 46. The loads are connected to the output terminal of the DC-DC converter 23. To the loads, no enable signal is input from the activation control circuit 22, and operation of the loads is not controlled by enable signals.

One end (first terminal) of the capacitor Cin is connected to an input side of the DC-DC converter 23. The other end (a second terminal) of the capacitor Cin is connected to a ground terminal being a reference terminal, via a switch SWin. The switch SWin is controlled to be turned on or off by an enable signal EN0 from a timing signal generating circuit 32 of the activation control circuit 22.

The activation control circuit 22 includes the resistances R1, R2, R3, and R4, a switch SWsh, the switch SWin, the linear regulator 31, the timing signal generating circuit 32, and the comparator CMP.

The resistance R4 and the resistance R3 are connected to each other in series, and they form a voltage dividing circuit. A connection point between the resistance R4 and the resistance R3 is connected to a capacitor Ch and a negative terminal of the comparator CMP via the switch SWsh. The switch SWsh is controlled to be turned on or off by a sample signal SH from the timing signal generating circuit 32.

Output voltage from the linear regulator 31 is supplied to the comparator CMP as its operating voltage and input into the timing signal generating circuit 32.

The timing signal generating circuit 32 starts operating in response to voltage supply from the linear regulator 31. When starting operating, the timing signal generating circuit 32 sets the sample signal SH at a high level for a predetermined time period (outputs a pulse having a width equivalent to the predetermined time period). This causes the switch SWsh to be turned on for the predetermined time period. By turning the switch SWsh on, the capacitor Ch retains voltage that is obtained by dividing input voltage Vin using the resistance R4 and the resistance R3. This voltage is a reference voltage Vref. The input voltage Vin to be divided is input voltage at no load (at a time when the capacitor Cin is not connected to the ground terminal), that is, input voltage at a time when no load circuit is connected when viewed from the power generator 11, and is equivalent to the open-circuit voltage Vopenpk of the power generating element.

The timing signal generating circuit 32 sets the enable signal EN0 at High after the sample signal SH becomes Low (i.e., after a lapse of the predetermined time period after the sample signal SH is set at High), so as to turn the switch SWin on. By turning the switch SWin on, charging of the capacitor Cin starts.

As in the first embodiment, by dividing the input voltage Vin using the resistance R2 and the resistance R1, the divided voltage Vdiv (=Vin×R1/(R1+R2)) is generated. Vdiv is input into a positive terminal of the comparator CMP. When the reference voltage Vref becomes equal to or higher than the divided voltage Vdiv retained in the capacitor Ch, the comparator CMP sets the enable signal EN1 at High.

Figure 5:
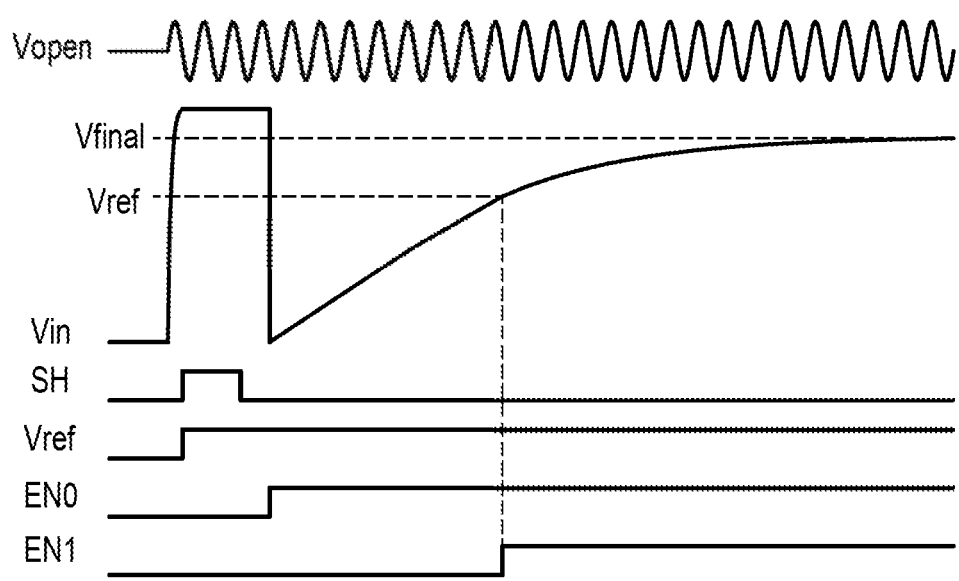
FIG. 5 is a diagram illustrating operation waveforms of generated voltage, input voltage, reference voltage, and various signals.

FIG. 5 illustrates operation waveforms of the power generating voltage Vopen, the input voltage Vin, the switch signal SH, the reference voltage Vref, the enable signal EN0, and the enable signal EN1.

Before the power generator 11 starts the power generation, the enable signal EN0 and the sample signal SH output from the timing signal generating circuit 32, and the enable signal EN1 output from the comparator CMP are all Low. Since the enable signal EN0 and the sample signal SH are Low, the switches SWin and SWsh are both off. In addition, since the enable signal EN1 is Low, the DC-DC converter 23 stops operating.

Since the switch SWin and the DC-DC converter 23 are both off, when the power generator 11 starts the power generation, the input voltage Vin to the DC-DC converter 23 rapidly increases. As the input voltage Vin increases, the timing signal generating circuit 32 and the comparator CMP being supplied with power by the linear regulator 31 both starts operating.

The timing signal generating circuit 32 starting operating sets the sample signal SH at a high level for a predetermined time period (outputs a pulse having a width equivalent to the predetermined time period), so as to turn the switch SWsh on for the predetermined time period. This causes the capacitor Ch to retain the reference voltage Vref that is obtained by dividing the input voltage at no load (at a time when no load circuit is connected when viewed from the power generator 11 because the DC-DC converter 23 is off, and the switch SWin is off), using the resistance R3 and the resistance R4.

Ignoring the forward voltages of the diodes forming the rectifying circuit 21, and letting Vopenpk denote the open-circuit voltage Vopen of the power generating element, $$Vref=\{R3/(R3+R4)\} \times Vopenpk$$

is established.

After the predetermined time period elapses, and the sample signal SH becomes Low, the timing signal generating circuit 32 sets the enable signal EN0 at High, so as to turn the switch SWin on. By turning the switch SWin on, charging of the capacitor Cin is started.

The input voltage Vin of the DC-DC converter 23 once drops to about zero and thereafter gradually increases. When the voltage Vdiv (=Vin×R1/(R1+R2)) obtained by dividing the input Vin using the resistance R2 and the resistance R1 becomes equal to the reference voltage Vref retained in the capacitor Ch, that is $$Vin = \frac{R3(R1 + R2)}{R1(R3 + R4)} Vopenpk \qquad \text{[Expression 1]}$$

is established, the comparator CMP sets the enable signal EN1 to be output to the DC-DC converter 23 at High.

Here, if values of the resistance R1 to the resistance R4 are set so that $$\frac{R3(R1 + R2)}{R1(R3 + R4)} Vopenpk \qquad \text{[Expression 2]}$$

takes a value slightly higher than ½ of Vopenpk, when the DC-DC converter 23 starts operating, the power generator output power Pharv reaches about the maximum value in the graph as illustrated FIG. 3 referred to in the description about the first embodiment. It is thereby possible to activate high-power loads including the wireless transmitter 45 reliably. That is, at a timing when the DC-DC converter 23 is turned on, the generated electric power is higher than a load power consumption (total of power consumptions of the DC-DC converter, the sensor, the memory, and the wireless transmitter). Therefore, even when the DC-DC converter 23 is turned on, the activation will not fail.

When the power generating element used in the power generator 11 is changed, the power generating voltage Vopen is also changed, and the amount of power generation is also changed. Therefore, the reference voltage needs to be appropriately set in conformity with a power generating element to be used. In this regard, since the reference voltage is generated by dividing the input voltage Vin at no load using the resistance R4 and the resistance R3 in the present embodiment, it is possible to automatically generate a reference voltage suitable for a power generating element to be used.

Third Embodiment

Figure 6:
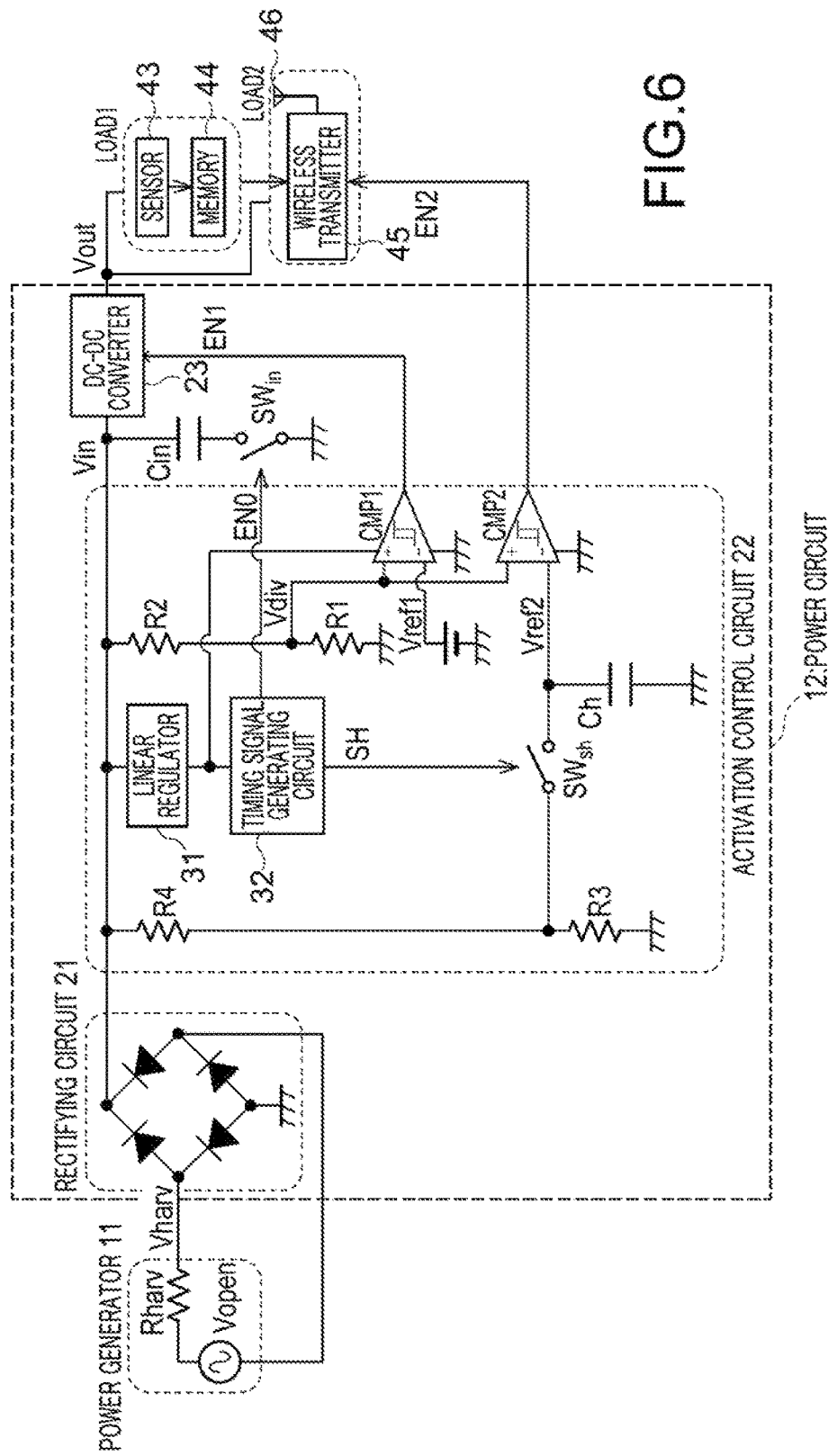
FIG. 6 is a circuit diagram illustrating a configuration example of a power device according to a third embodiment.

FIG. 6 is a circuit diagram illustrating a configuration example of a power device according to a third embodiment. Elements having the same names illustrated in FIG. 1 and FIG. 4 will be denoted by the same reference characters, and detailed description will not be made unless such an element performs extended or modified processing.

The power device illustrated in FIG. 6 is a combination of the power device in the first embodiment and the power device in the second embodiment. Specifically, the power device illustrated in FIG. 6 is a power device that implements both of successive activation of a plurality of loads and automatic generation of the reference voltage, at the same time. Specifically, operation of the comparator CMP1 illustrated in FIG. 6 is the same as in the first embodiment, and operation of the comparator CMP2 illustrated in FIG. 6 and automatic generation of the reference voltage to be provided to the comparator CMP2 are the same as in the second embodiment.

Reference voltage Vref1 input into the comparator CMP1 is a fixed value set in advance as in the first embodiment. When the divided voltage Vdiv becomes equal to or higher than the reference voltage Vref1, the comparator CMP1 outputs the enable signal EN1 being High. The DC-DC converter 23 is activated by this enable signal EN1 and starts a DC converting process. The load 1 starts operating based on voltage input from the DC-DC converter 23 and starts operation of sensing and storing sensor data.

The reference voltage Vref2 input into the comparator CMP2 is generated by dividing the input voltage Vin at no load using the resistance R4 and the resistance R3, as in the second embodiment. The generated reference voltage Vref2 is retained in the capacitor Ch. The comparator CMP2 outputs the enable signal EN2 being High when the above divided voltage Vdiv becomes equal to or higher than the reference voltage Vref2.

According to the present embodiment, by setting a value of the reference voltage Vref1 at a minimal value for activating the DC-DC converter 23 and the load 1, it is possible to activate the load 1 in an early stage. In addition, by activating the load 2 having a large power consumption when the generated electric power lies about its maximum value, in other words, by activating the load 2 when total power consumption by the DC-DC converter 23, the load 1, and the load 2 is higher than the generated electric power, it is possible to activate the load 2 reliably.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions.

The invention claimed is:

1. A power circuit, comprising:
    a DC-DC converter configured to convert input voltage into voltage that is different from the input voltage; and
    an activation control circuit configured to send a first enable signal to start operation of the DC-DC converter when voltage depending on the input voltage becomes equal to or higher than a first threshold voltage, and send a second enable signal to start operation of a load connected to an output side of the DC-DC converter when the voltage depending on the input voltage becomes equal to or higher than a second threshold voltage, the second threshold voltage being higher than the first threshold voltage, wherein
    the input voltage is voltage generated by a power generator that includes a power generating element,
    the first threshold voltage is lower than ½ of an open-circuit voltage of the power generating element, and
    the second threshold voltage is higher than the ½ of the open-circuit voltage of the power generating element.

2. The power circuit according to claim 1, wherein
    another load is connected to the output side of the DC-DC converter, and
    the other load is configured to start operation upon receiving converted voltage from the DC-DC converter which has started operation.

3. The power circuit according to claim 1, wherein the DC-DC converter is a step-down DC-DC converter.

4. The power circuit according to claim 1, further comprising:
    a rectifying circuit, wherein
    the rectifying circuit is configured to convert AC voltage generated by a power generator into DC voltage, and the DC voltage corresponds to the input voltage.

5. The power circuit according to claim 1, further comprising:
    a first comparator configured to compare the voltage depending on the input voltage with the first threshold voltage to output the first enable signal; and
    a second comparator configured to compare the voltage depending on the input voltage with the second threshold voltage to output the second enable signal.

6. The power circuit according to claim 5, wherein the first comparator and the second comparator are each a hysteresis comparator.

7. The power circuit according to claim 1, further comprising a capacitor connected between an input side of the DC-DC converter and a reference terminal.

8. A power device, comprising:
    the power circuit according to claim 1; and
    a power generator configured to generate AC voltage or DC voltage through power generation, wherein
    the input voltage is the DC voltage or a converted voltage of the AC voltage into DC.

9. The power device according to claim 8, further comprising the load.

10. A power circuit comprising:
    a DC-DC converter configured to convert input voltage into voltage that is different from the input voltage; and
    a capacitor including a first terminal that is connected to an input side of the DC-DC converter;
    a switch connected between a second terminal of the capacitor and a reference terminal; and
    an activation control circuit configured to generate a threshold voltage based on the input voltage of the DC-DC converter before starting operation, send a first enable signal to turn the switch on after generation of the threshold voltage, and send a second enable signal to start operation of the DC-DC converter when voltage depending on the input voltage becomes equal to or higher than the threshold voltage, wherein
    the input voltage is voltage generated by a power generator that includes a power generating element, and
    the threshold voltage is higher than ½ of an open-circuit voltage of the power generating element.

11. The power circuit according to claim 10, wherein the DC-DC converter is a step-down DC-DC converter.

12. The power circuit according to claim 10, further comprising:
    a rectifying circuit, wherein
    the rectifying circuit is configured to convert AC voltage generated by the power generator into DC voltage, and the DC voltage corresponds to the input voltage.

13. The power circuit according to claim 10, further comprising a comparator configured to compare the voltage depending on the input voltage with the threshold voltage to output the second enable signal.

14. The power circuit according to claim 13, wherein the comparator is a hysteresis comparator.

15. A power device comprising:
    the power circuit according to claim 10; and
    a power generator configured to generate AC voltage or DC voltage through power generation, wherein
    the input voltage is the DC voltage or a converted voltage of the AC voltage into DC voltage.

16. The power device according to claim 15, further comprising a load connected to an output side of the DC-DC converter.

* * * * *